United States Patent
Kim et al.

(10) Patent No.: US 8,058,913 B2
(45) Date of Patent: Nov. 15, 2011

(54) DLL-BASED MULTIPHASE CLOCK GENERATOR

(75) Inventors: Chulwoo Kim, Seoul (KR); Ja Bum Koo, Seoul (KR); Sung Hwa Ok, Seoul (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 153 days.

(21) Appl. No.: 12/392,495

(22) Filed: Feb. 25, 2009

(65) Prior Publication Data

US 2010/0013530 A1  Jan. 21, 2010

(30) Foreign Application Priority Data

Jul. 17, 2008  (KR) .................. 10-2008-0069755
Jul. 30, 2008  (KR) .................. 10-2008-0074503

(51) Int. Cl.
*H03L 7/06* (2006.01)

(52) U.S. Cl. ........................ 327/149; 327/158

(58) Field of Classification Search .............. 327/141, 327/156, 158, 161, 149
See application file for complete search history.

(56) References Cited

U.S. PATENT DOCUMENTS

| | | | |
|---|---|---|---|
| 6,784,707 B2 * | 8/2004 | Kim et al. | 327/158 |
| 7,084,676 B2 * | 8/2006 | Harron et al. | 327/105 |
| 2009/0167387 A1 * | 7/2009 | Kim | 327/157 |

* cited by examiner

*Primary Examiner* — Lincoln Donovan
*Assistant Examiner* — Diana J Cheng
(74) *Attorney, Agent, or Firm* — Rabin & Berdo, P.C.

(57) ABSTRACT

The present invention relates to a delay-locked loop-based multiphase clock generator that generates a plurality of multiphase clocks from an input clock signal using a voltage controlled delay line including a plurality of dummy cells. The delay-locked loop-based multiphase clock generator includes an anti-harmonic lock circuit that receives an input clock and a reference clock of multiple clocks, determines whether a pulse signal derived from the input clock is within a normal locking range of the reference clock, and outputs a compulsory control signal to compulsorily control an output signal of a phase detector if it is determined that the pulse signal is not within the normal locking range.

7 Claims, 12 Drawing Sheets

DLL-BASED MULTIPHASE CLOCK GENERATOR

CROSS-REFERENCE TO RELATED APPLICATION

This application claims the benefit of Korean Application No. 10-2008-0069755, filed on Jul. 17, 2008, and Korean Application No. 10-2008-0074503 filed on Jul. 30, 2008, with the Korean Intellectual Property Office, the disclosure of which are incorporated herein by reference.

BACKGROUND OF THE INVENTION

1. Field of the Invention

The present invention relates to a multiphase clock generator, and more particularly, to a delay-locked loop-based multiphase clock generator.

2. Description of the Related Art

With increase of data processing speed of computers and digital communication equipments, multiphase clocks have been increasingly used for increasing operation band width. A multiphase clock can overcome a limitation on clock speed of a microprocessor and may be used to process data with a bit rate higher than an internal operation frequency in a communication system. Such a multiphase clock is being widely used for high performance VLSI systems.

In the meantime, conventional delay-locked loop-based multiphase clock generators use a plurality of multiphase clocks output from a voltage controlled delay line (VCDL) for generating clocks at a high speed.

However, these conventional delay-locked loop-based multiphase clock generators have a problem of harmonic lock that two inputs of a phase detector are locked to more than two periods and further a problem that output frequencies may not be correctly generated due to a layout mismatch and a delay mismatch of delay cells constituting a voltage controlled delay line, which is caused by change of process/power source voltage/temperature.

In addition, power source voltage noises are generated by parasitic inductance components existing in metal conductive lines which are in proportion to variation of current flowing through the lines. Therefore, if current flowing through a conductive line is suddenly changed due to a sudden change of an operation frequency, power source voltage noises are increased, which may result in deterioration of performance of the whole circuit.

SUMMARY OF THE INVENTION

It is therefore an object of the present invention to provide a delay-locked loop-based multiphase clock generator which is capable of increasing an operation range of a frequency multiplier by constituting an anti-harmonic lock block using modified pulses.

It is another object of the present invention to provide a delay-locked loop-based multiphase clock generator which is capable of generating multiphase clocks at equal intervals by calibrating a delay mismatch generated in a voltage controlled delay line.

It is still another object of the present invention to provide a delay-locked loop-based multiphase clock generator which is capable of suppressing power source voltage noises caused by sudden change of frequencies of output clocks using a dithering circuit.

To achieve the above objects, according to an aspect, the present invention provides a delay-locked loop-based multiphase clock generator that generates a plurality of multiphase clocks from an input clock signal using a voltage controlled delay line including a plurality of dummy cells, including: an anti-harmonic lock circuit that receives an input clock and a reference clock of multiple clocks, determines whether a pulse signal derived from the input clock is within a normal locking range of the reference clock, and outputs a compulsory control signal to compulsorily control an output signal of a phase detector if it is determined that the pulse signal is not within the normal locking range.

Preferably, the delay-locked loop-based multiphase clock generator further includes a delay-locked loop that receives the multiple clocks, calibrates and controls a phase difference between the input clock and the reference clock, if any, using the compulsory control signal transmitted from the anti-harmonic lock circuit, and converts an UP signal or a DOWN signal indicating the phase difference into a control voltage to generate multiple calibration clocks for applying the control voltage to the multiple clocks.

Preferably, the delay-locked loop-based multiphase clock generator further includes a frequency multiplier that generates a multiplied clock by multiplying the multiple calibration clocks output through the voltage controlled delay line by a preset multiplication ratio.

Preferably, the delay-locked loop-based multiphase clock generator further includes a dithering circuit that removes interior noise parasitic to the multiplied clock by switching between a multiplied clock before being changed and a multiplied clock after being changed at least one time even when the multiplication ratio preset by the frequency multiplier is changed.

Preferably, the anti-harmonic lock circuit compares a phase difference between a modified input clock with even-numbered pulses of the input clock removed and the reference clock.

Preferably, the anti-harmonic lock circuit removes the even-numbered pulses of the input clock using at least one D flip-flop and at least one NAND gate.

Preferably, the anti-harmonic lock circuit uses an output signal of an edge detector to which an output signal of the NAND gate is input, as a reset signal of the D flip-flop.

According to another aspect, the present invention provides a delay-locked loop-based multiphase clock generator that generates a plurality of multiphase clocks from an input clock signal using a voltage controlled delay line including a plurality of dummy cells, including: a self-calibration buffer that self-calibrates irregular delay pulse widths formed between delay clocks belonging to multi-delayed clocks output from the voltage controlled delay line such that the delay pulse widths become equal to each other by controlling size or position of one or more delay clocks selected of the delay clocks.

Preferably, the delay-locked loop-based multiphase clock generator further includes a timing error comparator that self-calibrates irregular delay pulse widths formed between a first delay clock group and a second delay clock group input to the self-calibration buffer such that the delay pulse widths become equal to each other by controlling a rising edge or falling edge of one or more delay clocks selected of the delay clocks.

Preferably, the delay-locked loop-based multiphase clock generator further includes a frequency multiplier that extracts a plurality of setting clocks selected by applying a first setting clock group and a second setting clock group, which are changed when the first delay clock group and the second delay clock group are self-calibrated by the timing error comparator, to a preset multiplication ratio, and generates a multiplied clock by combining all the plurality of extracted setting clocks.

Preferably, the timing error comparator includes: a self-calibration phase detector that compares intervals of consecutive multiphase clocks passed through the self-calibration buffer; and a self-calibration charge pump that generates a control voltage using a comparative value from the self-calibration phase detector and controls a degree of delay of the self-calibration buffer based on the control voltage.

Preferably, the delay-locked loop-based multiphase clock generator further includes: a single-to-differential converter that divides the source clock into a differential input clock and a differential input inverted clock; a voltage controlled delay line that converts the differential input clock and the differential input inverted clock into a first input clock group including N+1 input clocks and a second input clock group including N+1 input inverted clocks, respectively; a self-calibration buffer that passes the first and second input clock groups through a plurality of buffers to output first and second delay clock groups, respectively; a phase detector that checks whether an N-th delay clock extracted from the first delay clock group is normally locked to a 0-th delay clock; and a charge pump that converts an UP signal and a DOWN signal generated by the phase detector into a control voltage if the N-th delay clock is not normally locked, and controls a preset phase difference by providing the control voltage to the first and second input clock groups.

According to still another aspect, the present invention provides a delay-locked loop-based multiphase clock generator that generates a plurality of multiphase clocks from an input clock signal using a voltage controlled delay line including a plurality of dummy cells, including: a dithering circuit that removes interior noise parasitic to the multiplied clock by switching between a multiplied clock before being changed and a multiplied clock after being changed at least one time even when a multiplication ratio preset by the frequency multiplier is changed.

Preferably, the dithering circuit includes: a plurality of change detection blocks that detects change of a 2-bit control signal and generates a short pulse when each bit of the 2-bit control signal is changed from 1 to 0 and vice versa; a D flip-flop that receives the short pulse at a clock terminal and changes an output value into 1 or 0; an AND gate having a first input terminal coupled to an output terminal of the D flip-flop and a second input terminal at which a reference clock signal is received; a counter that receives the reference clock signal, continues to operate until a counter value of an MSB address becomes 1, and outputs a counter value of an LSB address to the external; a multiplexer that outputs a multiplied clock before being changed upon receiving a counter value 1 of the LSB address and outputs a multiplied clock after being changed upon receiving a counter value 0 of the LSB address; and a rising edge detector that, when the counter value of the MSB address is changed from 0 to 1, further generates the short pulse to reset an output value of an output terminal of the D flip-flop and an output value of an output terminal of the counter to 0 simultaneously.

Preferably, when an input value of the first input terminal coupled to the output terminal of the D flip-flop is 0, an output value of an output terminal of the AND gate is equal to 0 irrespective of an input value of the second input terminal.

Preferably, the delay-locked loop-based multiphase clock generator further includes: an anti-harmonic lock circuit that receives an input clock and a reference clock of multiple clocks and determines whether a pulse signal derived from the input clock is within a normal locking range of the reference clock; a delay-locked loop that receives the multiple clocks, calibrates and controls a phase difference between the input clock and the reference clock, if any, using a compulsory control signal transmitted from the anti-harmonic lock circuit, and converts an UP signal or a DOWN signal indicating the phase difference into a control voltage to generate multiple calibration clocks for applying the control voltage to the multiple clocks; and a frequency multiplier that sets a multiplication ratio as a 2-bit control signal and generates a multiplied clock by multiplying the multiple calibration clocks by the set multiplication ratio.

Preferably, the anti-harmonic lock circuit removes even-numbered pulses of the input clock using at least one D flip-flop and at least one NAND gate.

Preferably, the anti-harmonic lock circuit uses an output signal of an edge detector to which an output signal of the NAND gate is input, as a reset signal of the D flip-flop.

Preferably, the delay-locked loop includes: a phase detector that uses the compulsory control signal transmitted from the anti-harmonic lock circuit to compulsorily control an UP signal or a DOWN signal indicating a phase difference between a pulse signal existing in the input clock and the reference clock; a charge pump that converts the UP signal or the DOWN signal indicating the phase difference into a control voltage; and a voltage controlled delay line that receives the multiple clocks and generates multiple calibration clocks by applying the control voltage, which is transmitted from the charge pump, to the multiple clocks.

Preferably, the delay-locked loop-based multiphase clock generator further includes a self-calibration buffer that self-calibrates irregular delay pulse widths formed between delay clocks belonging to multi-delayed clocks output from the voltage controlled delay line such that the delay pulse widths become equal to each other by controlling size or position of one or more delay clocks selected of the delay clocks.

According to the present invention, it is possible to reduce a load burden of a voltage controlled delay line and widen an operation band of a frequency multiplier by adding an anti-harmonic lock circuit to the voltage controlled delay line and using only the last multiple clock in the anti-harmonic lock circuit.

In addition, it is possible to calibrate a delay mismatch by synchronizing a multiplied clock with a reference clock using a delay-locked loop.

Furthermore, it is possible to reduce power source voltage noise using a dithering circuit.

BRIEF DESCRIPTION OF THE DRAWINGS

The above and/or other aspects and advantages of the present invention will become apparent and more readily appreciated from the following description of the embodiments, taken in conjunction with the accompanying drawings of which.

DETAILED DESCRIPTION OF THE PREFERRED EMBODIMENT

The present invention addresses a frequency multiplication technique and suggests a multiphase clock generator which is capable of preventing a harmonic lock in advance even when an input clock with a wider band width is input by deleting unnecessary pulses existing on a certain period of the input clock using an anti-harmonic lock block, and then including the pulses existing on the input clock in a certain period of a reference clock. In addition, the present invention suggests a delay-locked loop-based multiphase clock generator which is capable of removing interior noises caused by sudden change of a multiplication clock using a dithering circuit.

Although high frequency operation of detailed circuits constituting a delayed-lock loop has to be guaranteed in order to generate a high output frequency in the prior art, the present invention can alleviate design burden and reduce power consumption by generating a multiphase clock whose frequency is double as high as a reference clock frequency.

Hereinafter preferred embodiments of the present invention will be described in detail with reference to the accompanying drawings. In the following detailed description of the present invention, concrete description on related functions or constructions will be omitted if it is deemed that related known functions and/or constructions may unnecessarily obscure the gist of the present invention.

Figure 1:
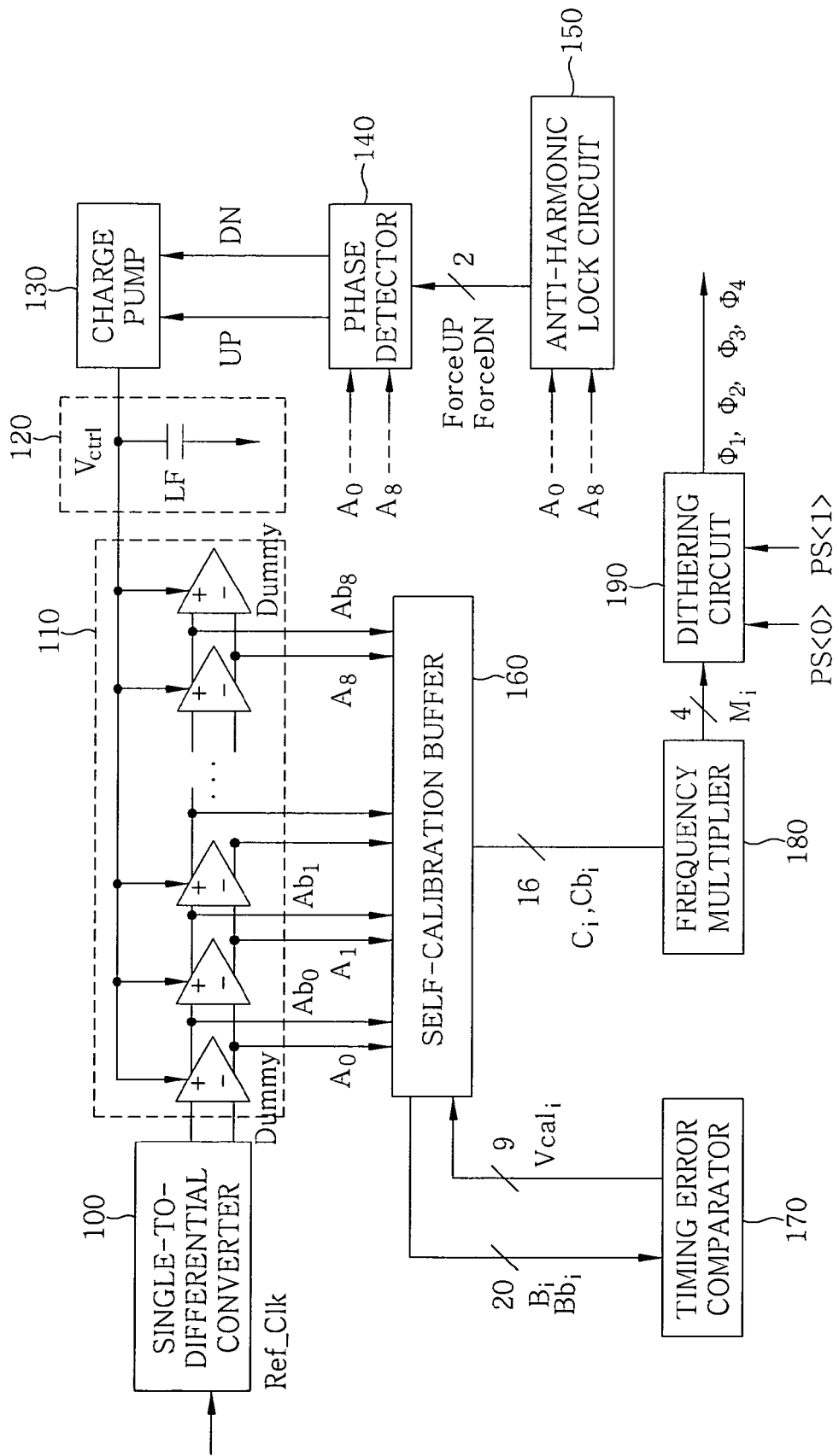
FIG. 1 is a whole circuit diagram of a delay-locked loop-based multiphase clock generator according to an embodiment of the invention.

FIG. 1 is a whole circuit diagram of a delay-locked loop-based multiphase clock generator according to an embodiment of the invention. Referring to FIG. 1, a delay-locked loop (DLL)-based multiphase clock generator of the present invention may include a delay-locked loop, a self-calibration circuit, a frequency multiplier 180, a dithering circuit 190, etc. Here, the delay-locked loop may include a voltage controlled delay line 110 constituted by a plurality of dummy cells, a loop filter (LF) 120, a charge pump 130 and a phase detector 140.

As shown in FIG. 1, the DLL-based multiphase clock generator self-calibrates a delay mismatch of multiphase clock signals generated in the voltage controlled delay line 110 and generates four multiphase clocks which are different by 90° in phase from each other, each having a frequency which is double as high as a reference clock frequency, according to such calibration.

The delay-locked loop includes the phase detector 140, the charge pump 130, the loop filter 120 and the voltage controlled delay line 110, as described above, and can generate a precise output frequency only when two inputs of the phase detector 140 are normally locked in one period.

At this time, a case where a reference clock and a feedback clock, which are inputs of the phase detector, are locked in more than two periods is referred to as "harmonic locking," in which the clock generator generates an incorrect output frequency. In the present invention, an anti-harmonic lock circuit 150 is additionally provided in order to prevent such harmonic locking.

Upon recognizing that the delay-locked loop is in a harmonic locked state, the anti-harmonic lock circuit 150 sends a control signal to the phase detector 140 to control the phase detector 140 to output an 'Up' or 'Down' signal until the feedback clock is shifted into a normal locking range.

In addition, the present invention further provides a self-calibration circuit to calibrate a delay mismatch generated in the voltage controlled delay line 110 in order to generate multiphase clock signals at equal intervals. The self-calibration circuit may include a self-calibration buffer 160 and a timing error comparator 170.

The self-calibration circuit of the present invention may generate the multiphase clocks at equal intervals without having an effect on operation of the voltage controlled delay line 110.

The signals with the delay mismatch calibrated in this manner are input to the frequency multiplier 180 which uses the self-calibrated multiphase clocks to double frequencies of the input signals. Thus, since the delay-locked loop may operate at a frequency, which is half the frequencies of the input signals, in order to generate a required frequency, design burden and power consumption can be reduced.

If an output frequency is suddenly changed in the multiphase clock generator of the present invention, power source voltage noises may increase. The present invention further provides a dithering circuit 190 in order to prevent circuit performance from being deteriorated due to such power source voltage noises. The dithering circuit 190 reduces a power source voltage by alternating an output of the clock generator between a frequency before being changed and a frequency after being changed several times.

Hereinafter, the configuration and operation of the multiphase clock generator shown in FIG. 1.

The multiphase clock generator of the present invention compares multi-delayed clocks having random delay differences, self-calibrates a delay mismatch between the multi-delayed clocks to generate multi-delayed clocks having regular and constant delay pulse width, and multiplies frequencies of the generated multi-delayed clocks.

The multiphase clock generator of the present invention performs delay-locked loop operation in which phase difference information obtained by measuring a differential clock generated through a single-to-differential converter 100 by means of the phase detector 140 appears as a control voltage through the charge pump 130 and is synchronized with a reference input clock through the voltage controlled delay line 110 having a certain degree of delay by the control voltage.

In this case, the self-calibration circuit compares adjacent multiphase clocks of outputs of the self-calibration buffer 160 and calibrates a mismatch to generate N multiphase clocks with an equal interval.

In this manner, the multiphase clock generator is configured to include the delay-locked loop, the self-calibration circuit and the frequency multiplier 180.

More specifically, the multiphase clock generator includes a single-to-differential converter (S2D) 100, a voltage controlled delay line (VCDL) 110, a self-calibration buffer 160, an anti-harmonic lock block 150, a phase detector 140 and a charge pump 130.

The single-to-differential converter 100 receives a source clock from the external and divides the source clock into a differential input clock and a differential input inverted clock. The differential input clock and the differential input inverted clock are generally called multi-differential clock.

The voltage controlled delay line 110 receives the differential input clock and the differential input inverted clock and generates a first input clock group $A_0$~$A_N$ including a plurality (N+1) of input clocks by generating a time delay difference N times on the basis of a 0-th input clock $A_0$ extracted from the differential input clock. For convenience' sake, FIG. 1 shows a case where N is 8.

Similarly, the voltage controlled delay line 110 generates a second input clock group $Ab_0$~$Ab_N$ including a plurality (N+1) of input inverted clocks by generating a time delay difference N times on the basis of a 0-th input inverted clock $Ab_0$ extracted from the differential input inverted clock.

That is, the voltage controlled delay line 110 uses N buffers provided therein to generate the differential input clock and the differential input inverted clock as the first input clock group $A_0$~$A_N$ and the second input clock group $Ab_0$~$Ab_N$, respectively.

The self-calibration buffer 160 generates N time delay differences by passing the first input clock group $A_0$~$A_N$, which is transmitted from the voltage controlled delay line 110, through a plurality of buffers and converts the first input clock group $A_0$~$A_N$ into a first delay clock group $B_0$~$B_N$ including a plurality (N+1) of delay clocks.

Similarly, the self-calibration buffer 160 generates N time delay differences by passing the second input clock group $Ab_0$~$Ab_N$, which is transmitted from the voltage controlled delay line 110, through a buffer stage and converts the second input clock group $Ab_0$~$Ab_N$ into a second delay clock group $Bb_0$~$Bb_N$ including a plurality (N+1) of delay inverted clocks.

As a pulse delay width between the first and second delay clock groups $B_0$~$B_N$ and $Bb_0$~$Bb_N$ output from the self-calibration buffer 160 forms irregular and non-uniform delay differences, the multiphase clock generator according to the embodiment of the present invention uses a timing error comparator 170 to form a regular and uniform delayed pulse width between delay clocks of the first and second delay clock groups $B_0$~$B_N$ and $Bb_0$~$Bb_N$. In the present invention, the first and second delay clock groups $B_0$~$B_N$ and $Bb_0$~$Bb_N$ are generally called multi-delayed clock.

The phase detector 140 receives compulsory control signals (Active signal, ForceUP signal and ForceDN signal) transmitted from the anti-harmonic lock block 150 and a 0-th input clock $A_0$ and a 8-th input clock $A_8$ of the first input clock group $A_0$~$A_N$ transmitted from the voltage controlled delay line 110.

At this time, the phase detector 140 causes compulsory control signals (ForceUP signal and ForceDN signal) of the anti-harmonic lock block 150 to compulsorily control the 8-th input clock $A_8$ such that this clock is normally locked within one period of the 0-th input clock $A_0$.

In other words, the anti-harmonic lock block 150 applies the compulsory control signals (ForceUP signal and ForceDN signal) to the phase detector 140 to control an N-th input clock $A_N$ input to the phase detector 140 such that this clock is normally locked within one period or below of the 0-th input clock $A_0$.

At this time, if the N-th input clock $A_N$ is not locked to the 0-th input clock $A_0$, the phase detector 140 generates an UP signal and a DOWN signal indicating a phase difference between the 0-th input clock $A_0$ and the N-th input clock $A_N$.

The phase detector 140 transmits the UP signal and the DOWN signal to the charge pump 130 and the charge pump 130 generates a control voltage $V_{ctrl}$ matching with the UP and DOWN signals.

The charge pump 130 puts the control voltage $V_{ctrl}$ into the voltage controlled delay line 110 and controls a phase difference established between N+1 input clocks formed in the first input clock group $A_0$~$A_N$ of the voltage controlled delay line 110 and N+1 input inverted clocks formed in the second input clock group $Ab_0$~$Ab_N$.

In addition, the charge pump 130 controls and synchronizes the phase difference such that the N-th input clock $A_N$ of the first input clock group $A_0$~$A_N$ is normally locked to the 0-th input clock $A_0$.

In the meantime, the timing error comparator 170 of the multiphase clock generator according to the embodiment of the present invention generates first and second setting clock groups $C_0$~$C_N$ and $Cb_0$~$Cb_N$ having a regular and constant delay pulse width by self-calibrating a delay mismatch formed between the first and second delay clock groups $B_0$~$B_N$ and $Bb_0$~$Bb_N$ which are adjacent multi-delayed clocks output from the self-calibration buffer 160.

That is, the timing error comparator 170 self-calibrates the first and second delay clock groups $B_0$~$B_N$ and $Bb_0$~$Bb_N$ received from the self-calibration buffer 160.

At this time, the timing error comparator 170 generates a first delay pulse width (cal_dn pulse) indicating a delay difference between an i-th delay clock $B_i$ and an (i+1)-th delay clock $B_{i+1}$ of the first delay clock group.

Similarly, the timing error comparator 170 generates a second delay pulse width (cal_up pulse) indicating a delay difference between the (i+1)-th delay clock $B_{i+1}$ and an (i+2)-th delay clock $B_{i+2}$ of the first and second delay clock groups $B_0$~$B_N$ and $Bb_0$~$Bb_N$.

Then, the timing error comparator 170 performs self-calibration to control size or position of the second delay pulse width (cal_up pulse) with respect to the first delay pulse width (cal_dn pulse) by changing a rising edge or a falling edge of the (i+1)-th delay clock $B_{i+1}$ so that the first delay pulse width (cal_dn pulse) becomes equal to the second delay pulse width (cal_up pulse).

In addition, the timing error comparator 170 generates a pulse width calibration voltage Vcal to calibrate a pulse width such that the first delay pulse width (cal_dn pulse) becomes equal to the second delay pulse width (cal_up pulse) (cal_dn pulse=cal_up pulse).

Next, the timing error comparator 170 transmits the pulse width calibration voltage Vcal to the self-calibration buffer 160 and the self-calibration buffer 160 performs self-calibration to make the first delay pulse width (cal_dn pulse) equal to the second delay pulse width (cal_up pulse) by applying the pulse width calibration voltage Vcal to the first and second delay clock groups $B_0$~$B_N$ and $Bb_0$~$Bb_N$.

The frequency multiplier 180 receives the first and second setting clock groups $C_0$~$C_N$ and $Cb_0$~$Cb_N$ having the self-calibrated regular and constant delay pulse width from the timing error comparator 170 and combines a plurality of setting clocks selected according to a preset multiplication ratio ($2^n$, where n=−1, 0, 1, 2, 3, 4, 5 and 6) to generate various multiplication clocks.

The frequency multiplier 180 transmits one or more digital codes D<4, 1>, which are predetermined in proportion to an multiplication integer n determined under control of an input coding unit (not shown) provided therein or connected to a shield, to a short pulse generator provided therein and causes an edge combiner to extract the number of setting clocks corresponding to $2^n*½$ of 2(N+1) clocks of the first and second setting clock groups $C_0$~$C_N$ and $Cb_0$~$Cb_N$ and selectively combine the extracted setting clocks to generate various multiplication clocks which are x times as large as the original clocks.

For example, if the input coding unit provided in the frequency multiplier 180 or connected to the shield determines the multiplication integer (n) to be 4, the edge combiner selectively combines only 8 setting clocks corresponding to $2^4*½$ of 34 clocks of the first and second setting clock groups $C_0$~$C_N$ and $Cb_0$~$Cb_N$ to generate multiplication clocks which are four times as large as the original clocks.

As another example, if the input coding unit provided in the frequency multiplier 180 or connected to the shield determines the multiplication integer (n) to be 5, the edge combiner selectively combines only 16 setting clocks corresponding to $2^5*½$ of 34 clocks of the first and second setting clock groups $C_0$~$C_N$ and $Cb_0$~$Cb_N$ to generate multiplication clocks which are eight times as large as the original clocks.

As still another example, if the input coding unit provided in the frequency multiplier 180 or connected to the shield determines the multiplication integer (n) to be 6, the edge combiner selectively combines only 32 setting clocks corresponding to $2^6*½$ of 34 clocks of the first and second setting clock groups $C_0$~$C_N$ and $Cb_0$~$Cb_N$ to generate multiplication clocks which are sixteen times as large as the original clocks.

Hereinafter, operation of each block in the multiphase clock generator shown in FIG. 1 will be described in more detail with reference to FIGS. 2 to 14.

<Anti-Harmonic Lock Circuit>

First, the anti-harmonic lock circuit will be described with reference to FIGS. 2 to 5.

A conventional anti-harmonic lock circuit detects some of multiphase clocks output from the voltage controlled delay line 110 and determines whether or not the $A_8$ clock is within a normal locking range. At this time, a relative position between rising edges of a reference clock and multiphase clocks is detected and the detected relative position is converted into a digital value.

In the meantime in order to prevent a harmonic lock, that is, to prevent the last multiphase clock of the voltage controlled delay line 110 from being locked after two or three periods of the reference clock, the last multiphase clock has to be in a position between 0.5 periods and 1.5 periods of the reference clock. If the $A_8$ clock is not positioned within such a normal locking range, an output signal of the phase detector 140 is compulsorily controlled to position the $A_8$ clock within the normal locking range, as described above.

Figure 2A:
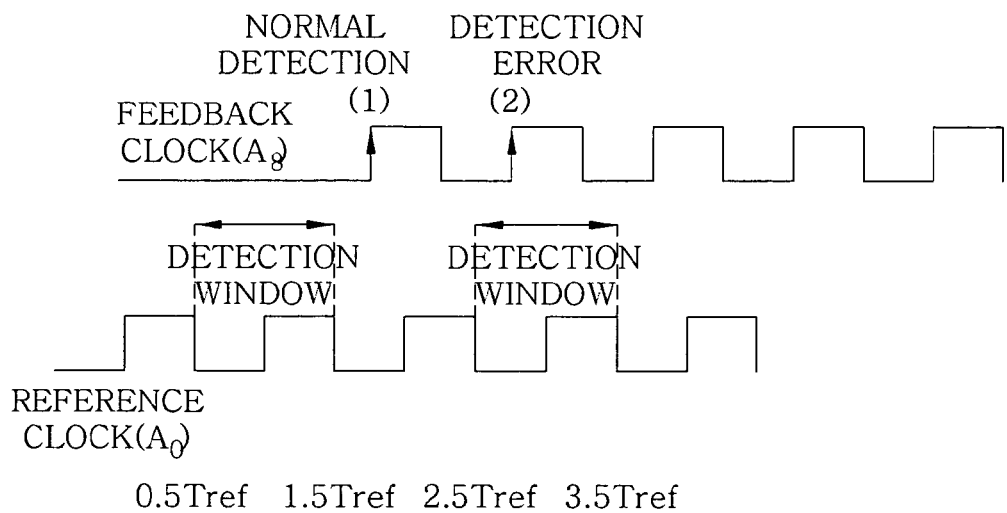
FIG. 2a is a diagram showing a waveform of a conventional anti-harmonic lock circuit.
Figure 2B:
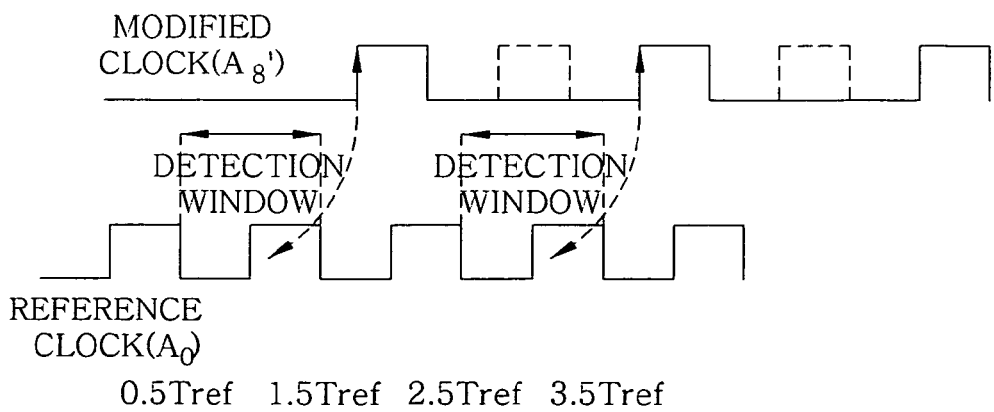
FIG. 2b is a diagram showing a waveform of an anti-harmonic lock circuit according to an embodiment of the invention.

FIG. 2a is a diagram showing a waveform of a conventional anti-harmonic lock circuit and FIG. 2b is a diagram showing a waveform of an anti-harmonic lock circuit according to an embodiment of the invention.

As shown in FIG. 2a, although harmonic locking actually occurs due to a difference by more than two periods between the reference clock $A_0$ and the clock $A_8$, since a rising edge of P2 is within a detection window, the harmonic locking may not be properly detected.

To avoid this, the harmonic locking is detected using an $A_{8'}$ clock generated by removing a pulse corresponding to P2 from the $A_8$ clock, as shown in FIG. 2b.

Figure 3A:
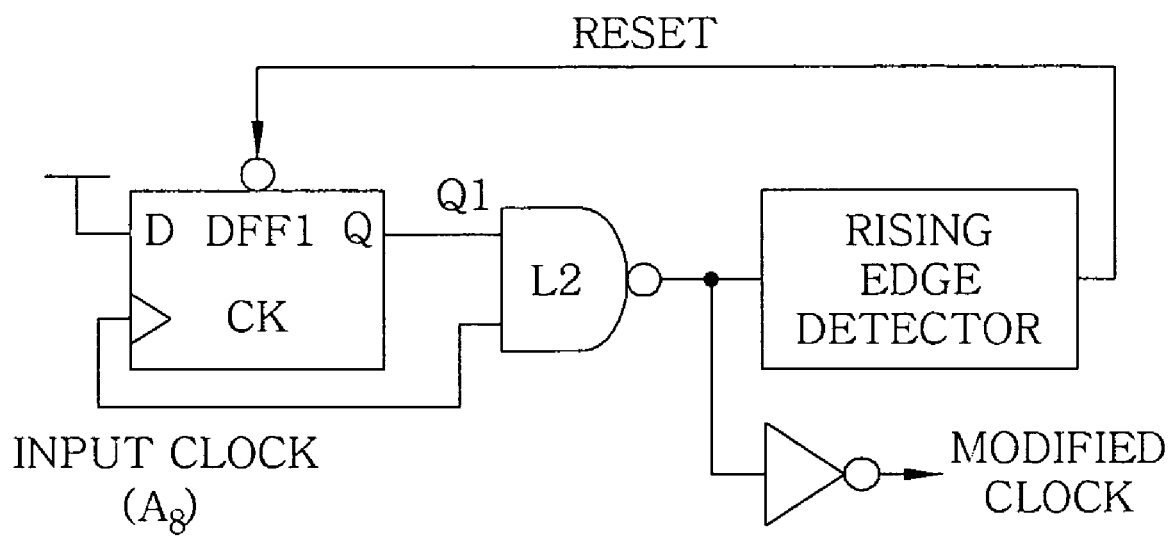
FIGS. 3a and 3b are ForceUP signal generating circuit diagrams of the anti-harmonic lock circuit according to the embodiment of the invention.
Figure 3B:
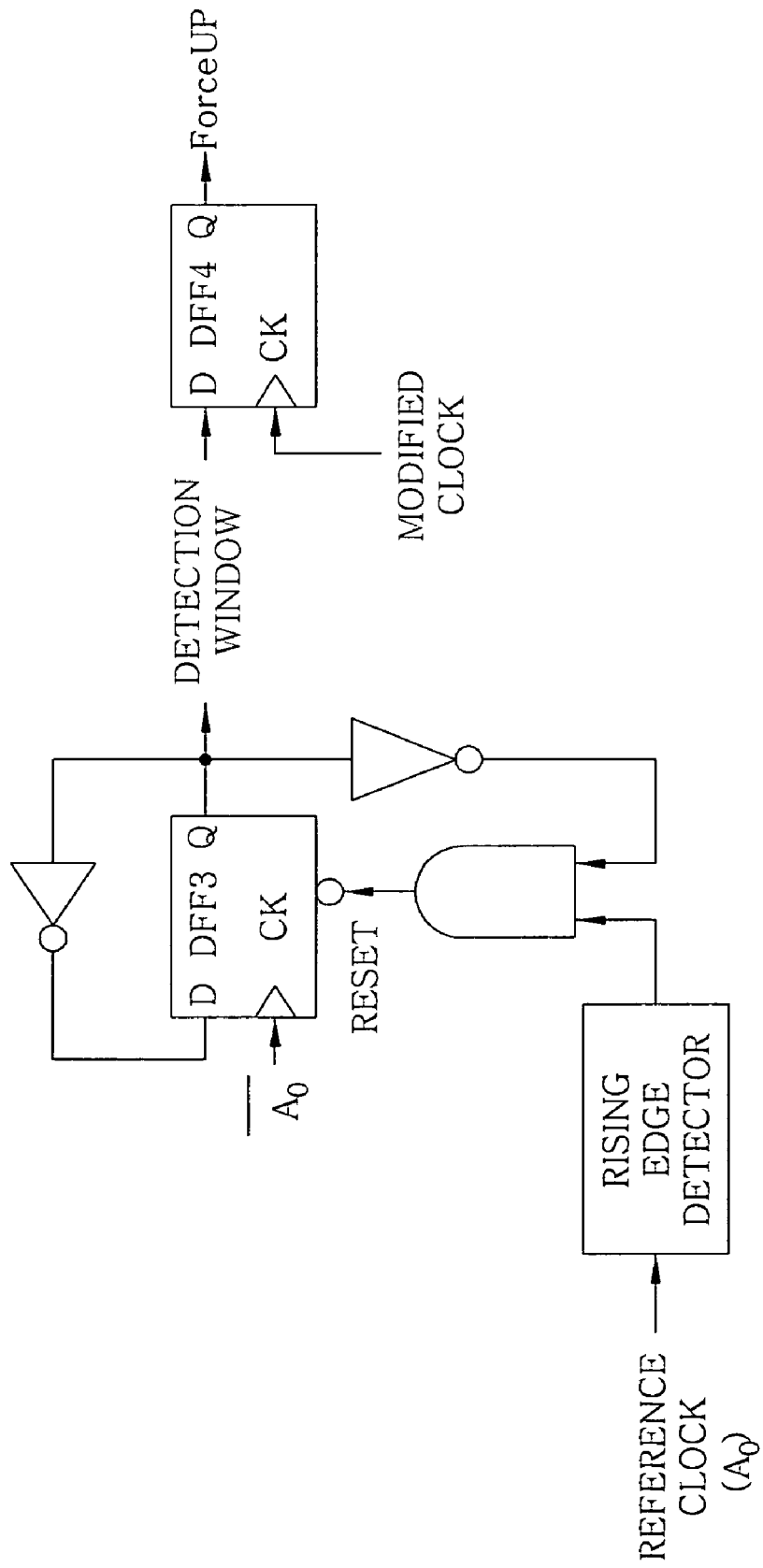
Figure 4A:
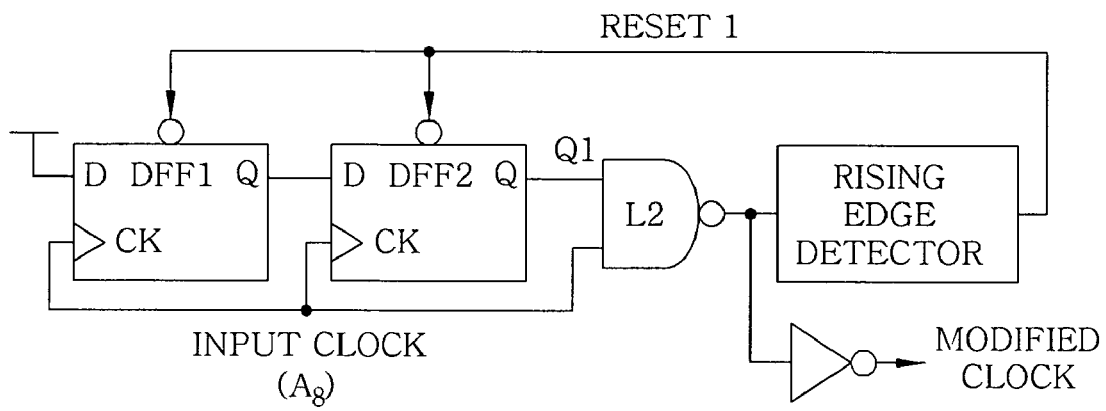
FIGS. 4a and 4b are ForceDN signal generating circuit diagrams of the anti-harmonic lock circuit according to the embodiment of the invention.
Figure 4B:
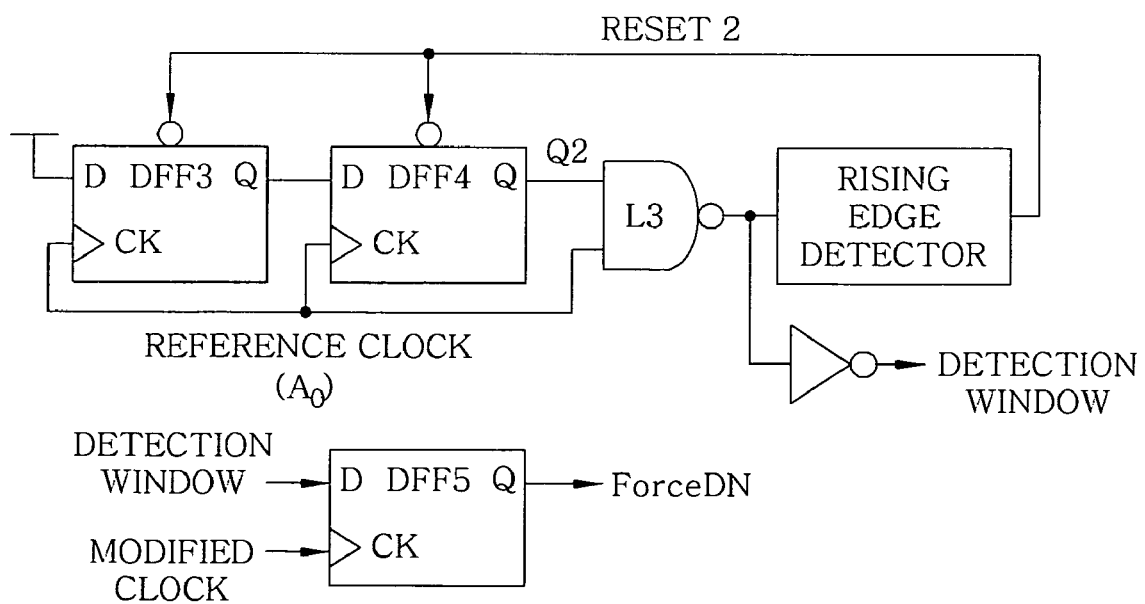

FIGS. 3a and 3b are ForceUP signal generating circuit diagrams of the anti-harmonic lock circuit according to the embodiment of the invention, and FIGS. 4a and 4b are ForceDN signal generating circuit diagrams of the anti-harmonic lock circuit according to the embodiment of the invention.

Referring to FIG. 3a, an A8 clock is input, as a clock signal, to a D flip-flop DFF1, and an output signal of the D flip-flop and the A8 clock are input to an NAND gate L2. When an output signal of L2 is passed through an NOT gate, a modified clock is output. At this time, the output signal of L2 is also input to a reset of DFF1 via a rising edge detector.

The output modified clock is input, as a clock signal, to a D flip-flop DFF4 shown in FIG. 3b.

Referring to FIG. 3b, $\overline{A_0}$ is input to clock of DFF3, and a signal, which is an inversion of an output of DFF3, becomes an input signal. In addition, the inverted signal of the output of DFF3 and an output signal of a rising edge detector to which a reference clock $A_0$ is input are input to an AND gate. An output signal of the AND gate is input, as a reset signal, to DFF3.

In this manner, the output signal of DFF3 becomes a detection window which is an input signal of DFF4, and the modified clock generated in FIG. 3a is input, as a clock signal, to DFF4. Finally, an output signal of DFF4 becomes the ForceUP signal output from the anti-harmonic lock block 150.

Referring to FIG. 4a, an A8 clock is input, as a clock signal, to D flip-flops DFF1 and DFF2, and an output signal Q1 from DFF1 and DFF2 and the input signal A8 are input to an NAND gate L2. When an output signal of L2 is passed through an NOT gate, a modified clock is output. At this time, the output signal of L2 is also input to resets of DFF1 and DFF2 via a rising edge detector.

The output modified clock is input, as a clock signal, to a D flip-flop DFF5 shown in FIG. 4b.

Referring to FIG. 4b, $\overline{A_0}$ is input to clocks of DFF3 and DFF4, and an output signal Q2 of DFF3 and DFF4 is inverted after passing through an NAND gate L3. This inverted signal becomes a detection window. In addition, a signal output from the rising edge detector to which Q2 passed through the NAND gate L3 is input become a reset signal of DFF3 and DFF4.

In this manner, the output inverted signal of L3 becomes the detection window which is an input signal of DFF5, and the modified clock generated in FIG. 4a is input, as a clock signal, to DFF5. Finally, an output signal of DFF5 becomes the ForceDN signal output from the anti-harmonic lock block 150.

In this manner, if the $A_{8'}$ signal is out of the normal locking range, the anti-harmonic lock block 150 of this embodiment of the present invention generates the ForceUP and ForceDN signals which compulsorily control the output signal of the phase detector 140 to prevent a harmonic lock.

Figure 5:
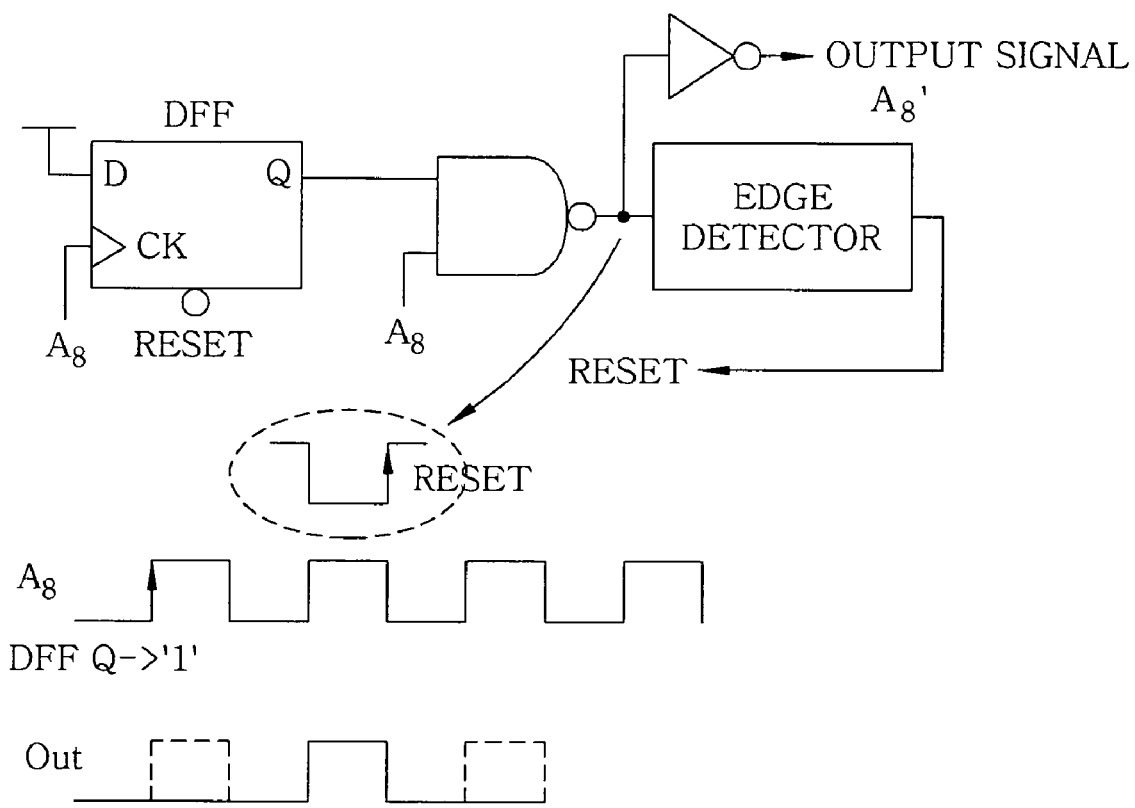
FIG. 5 shows an $A_{8'}$ signal generating circuit and its input and output waveform according to an embodiment of the invention.

FIG. 5 shows a method of generating the $A_{8'}$ signal for output of the ForceUP and ForceDN signals shown in FIGS. 3 and 4. Referring to FIG. 5, a signal output from DFF and A8 are input to an NAND gate. An output signal of the NAND gate is inverted into an $A_{8'}$ signal. At this time, $A_8$ is input to a clock of DFF, and the output signal of the NAND gate is passed through an edge detector and is input, as a reset signal, to DFF.

Thus, as shown in the bottom of FIG. 5, the $A_8$ signal is converted into the $A_{8'}$ signal.

<Self-calibration Circuit>

In the present invention, irregular delay pulse widths established between multiphase clocks output from the voltage controlled delay line 110 are self-calibrated such that size or position of one or more delay clocks selected from the above delay clocks is controlled to make intervals between the multiphase clocks equal to each other.

Figure 6A:
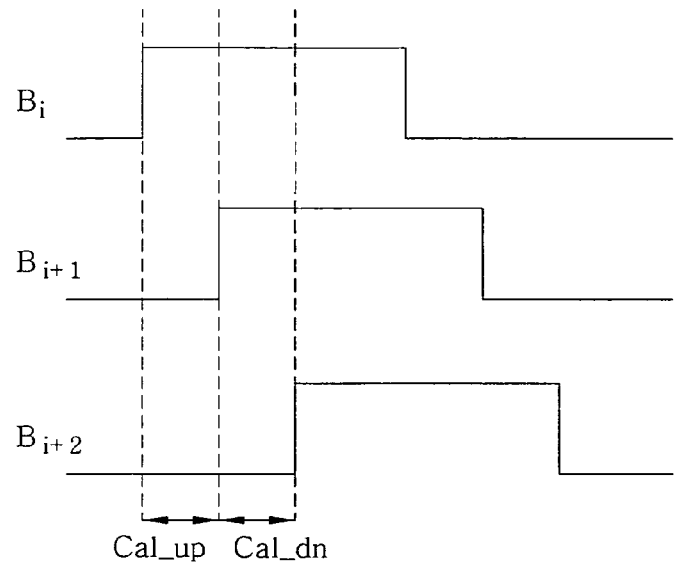
FIG. 6a is a conceptual view of a delay mismatch calibration circuit according to an embodiment of the invention.
Figure 6B:
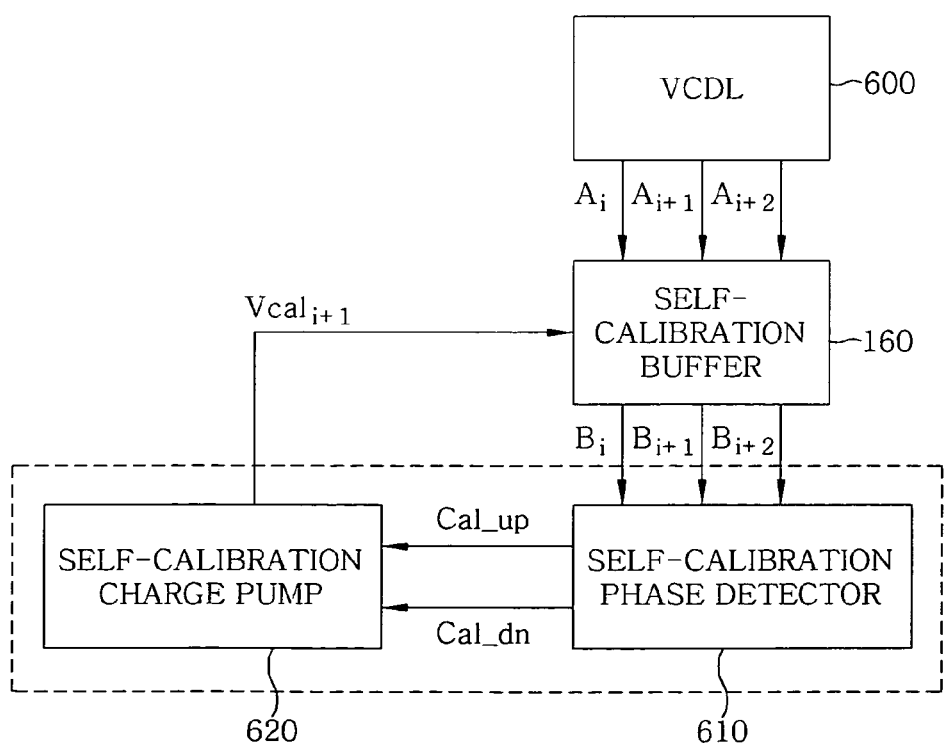
FIG. 6b is a block diagram showing the delay mismatch calibration circuit according to the embodiment of the invention.
Figure 7:
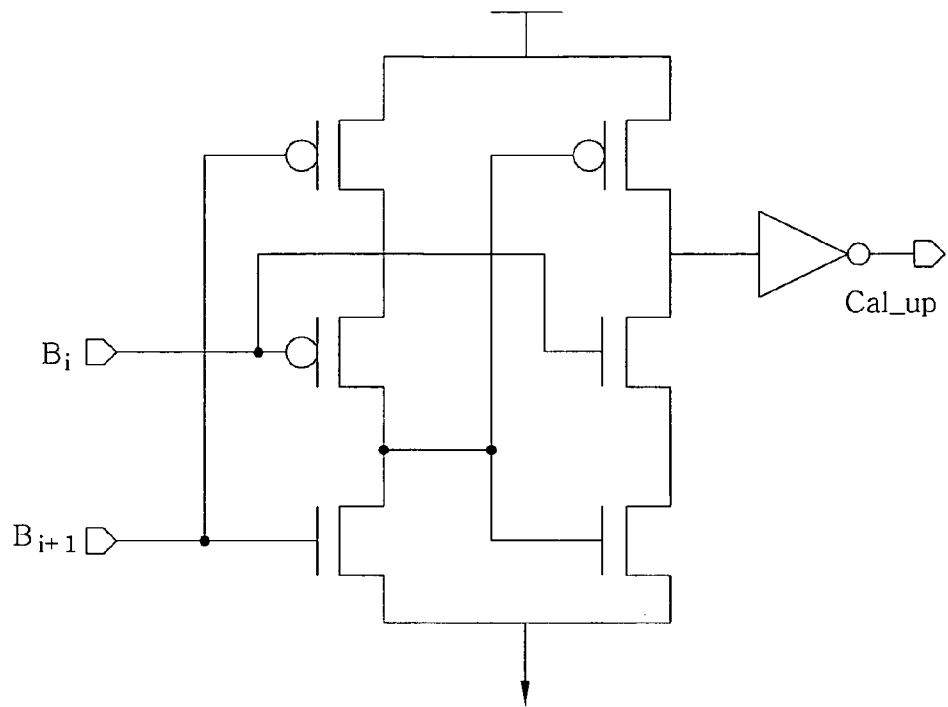
FIG. 7 is a circuit diagram of a self-calibration phase detector according to an embodiment of the invention.
Figure 8:
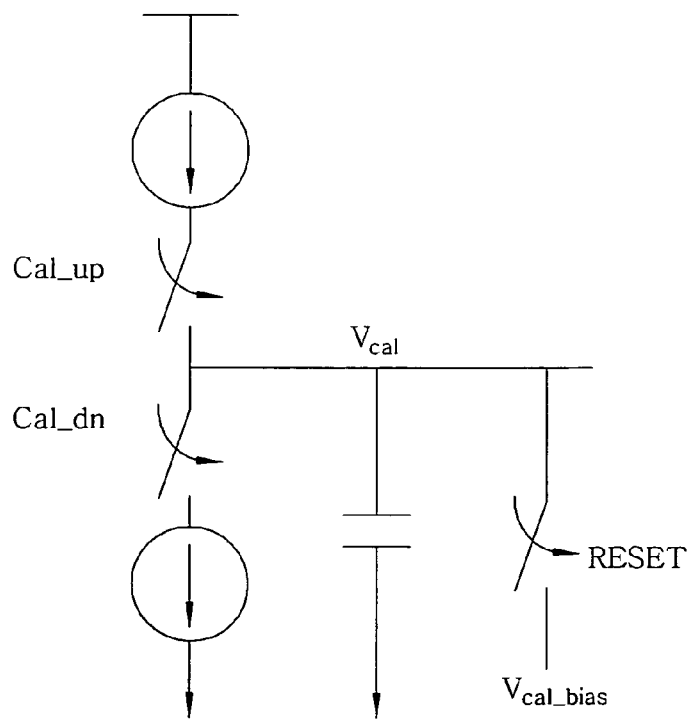
FIG. 8 is a circuit diagram of a self-calibration charge pump according to an embodiment of the invention.

FIGS. 6 to 8 are views showing the timing error comparator 170 provided in the multiphase clock generator according to the embodiment of the present invention and a timing diagram thereof.

Referring to FIGS. 6a and 6b, the self-calibration circuit according the embodiment of the present invention uses a self-calibration phase detector 610 to compare intervals between consecutive multiphase clocks which are output from the voltage controlled delay line 110 and 600 and passed through the self-calibration buffer 160. The self-calibration phase detector 610 operates a self-calibration charge pump 620 to generate a control voltage to control a degree of delay of the self-calibration buffer 160.

Referring to FIG. 7, the self-calibration phase detector 610 self-calibrates a delay mismatch between the first and second delay clock groups $B_0 \sim B_N$ and $Bb_0 \sim Bb_N$, which are adjacent multi-delayed clocks output from the self-calibration buffer 160, to thereby generate the first and second delay clock groups $B_0 \sim B_N$ and $Bb_0 \sim Bb_N$ having regular and constant delay pulse widths.

When multiphase output signals of the voltage controlled delay line 600 are passed through the self-calibration buffer 160, with the delay mismatch held therein, the timing error comparator 170 detects a delay difference between the multiphase output signals and controls delay time of the self-calibration buffer 160 in such a manner that the delay difference becomes small.

That is, the timing error comparator 170 performs self-calibration for the first and second delay clock groups $B_0 \sim B_N$ and $Bb_0 \sim Bb_N$ received from the self-calibration buffer 160.

At this time, the timing error comparator 170 generates a first delay pulse width (cal_up pulse) indicating a delay difference between an i-th delay clock $B_i$ and an (i+1)-th delay clock $B_{i+1}$ of the first delay clock group, as shown in FIG. 7.

Similarly, although not shown in the figure, the timing error comparator 170 generates a second delay pulse width (cal_dn pulse) indicating a delay difference between the (i+1)-th delay clock $B_{i+1}$ and an (i+2)-th delay clock $B_{i+2}$ of the first delay clock group.

In the meantime, the timing error comparator 170 inputs, as switching signals, the first delay pulse width (cal_up pulse) generated by operating the i-th delay clock and the (i+1)-th delay clock and the second delay pulse width (cal_dn pulse) generated by operating the (i+1)-th delay clock and the (i+2)-th delay clock.

Here, a voltage $V_{cal\_bias}$ is appropriately applied to the self-calibration charge pump 620 of the timing error comparator 170 such that a voltage across a corresponding node has no ground value, thereby preventing malfunction of the timing error comparator which performs self-calibration.

Accordingly, as shown in FIG. 8, the self-calibration charge pump 620 of the timing error comparator 170 generates a pulse with calibration voltage $Vcal_{i+1}$ to calibrate and control a pulse width such that the second delay pulse width (cal_dn pulse) becomes equal to the first delay pulse width (cal_up pulse) (cal_dn pulse=cal_up pulse).

Next, the self-calibration charge pump 620 of the timing error comparator 170 transmits the pulse with calibration voltage $Vcal_{i+1}$ to the self-calibration buffer 160 and causes the self-calibration buffer 160 to perform self-calibration such that the first delay pulse width (cal_up pulse) becomes equal to the second delay pulse width (cal_dn pulse) by applying the pulse with calibration voltage $Vcal_{i+1}$ to the first and second delay clock groups $B_0 \sim B_N$ and $Bb_0 \sim Bb_N$.

<Multiphase Clock Generation Circuit>

FIGS. 9 to 13 are views showing generation of multiphase clocks by the frequency multiplier 180.

Figure 9:
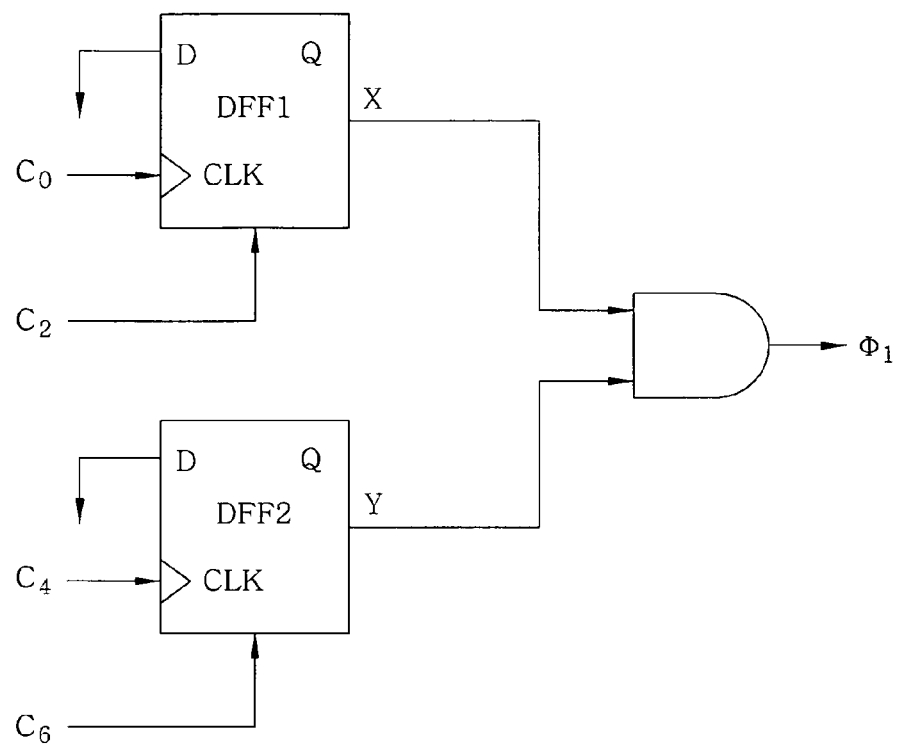
FIG. 9 shows a frequency multiplier and a circuit diagram for generating a first multiphase clock.

The suggested multiphase-clock generators generate multiphase clocks whose frequency is twice multiplied using self-calibrated multiphase clocks. At this time, a phase difference between four multiphase output clocks remains at 90°. FIG. 9 shows a first multiphase clock generation circuit.

In the meantime, each of the multiphase clock generators includes two D flip-flops DFF (an upper DFF being called first DFF and a lower DFF being called second DFF for convenience' sake) and one AND gate.

Referring to FIG. 9, $C_0$ and $C_4$ are input, as clock signals, to the first and second DFFs, respectively, and $C_2$ and $C_6$ are input, as reset signals, to the first and second DFFs, respectively. Output signals X and Y of these DFFs are input to an AND gate from which a final output signal $\Phi_1$ is generated.

Figure 10:
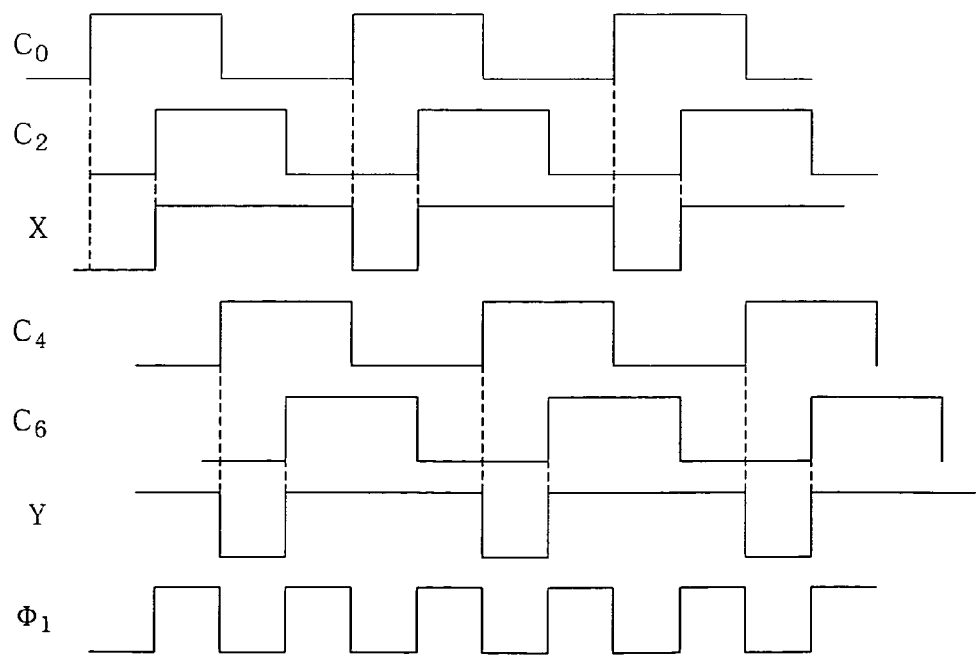
FIG. 10 is an operation waveform diagram of the circuit shown in FIG. 9.
Figure 11:
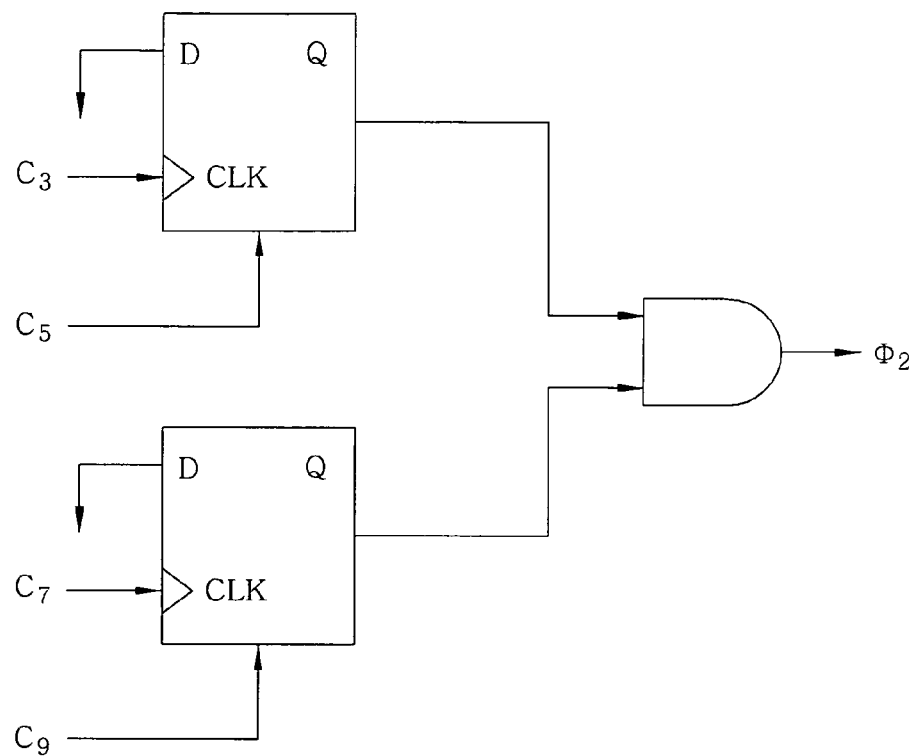
FIG. 11 is a circuit diagram for generating a second multiphase clock according to an embodiment of the invention.
Figure 12:
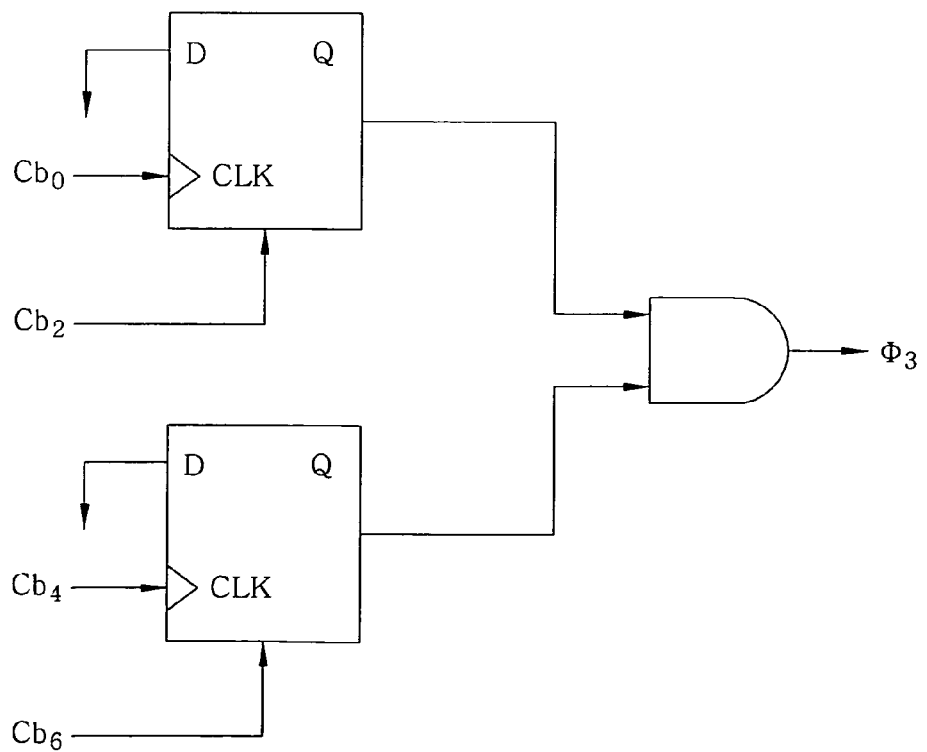
FIG. 12 is a circuit diagram for generating a third multiphase clock according to an embodiment of the invention.
Figure 13:
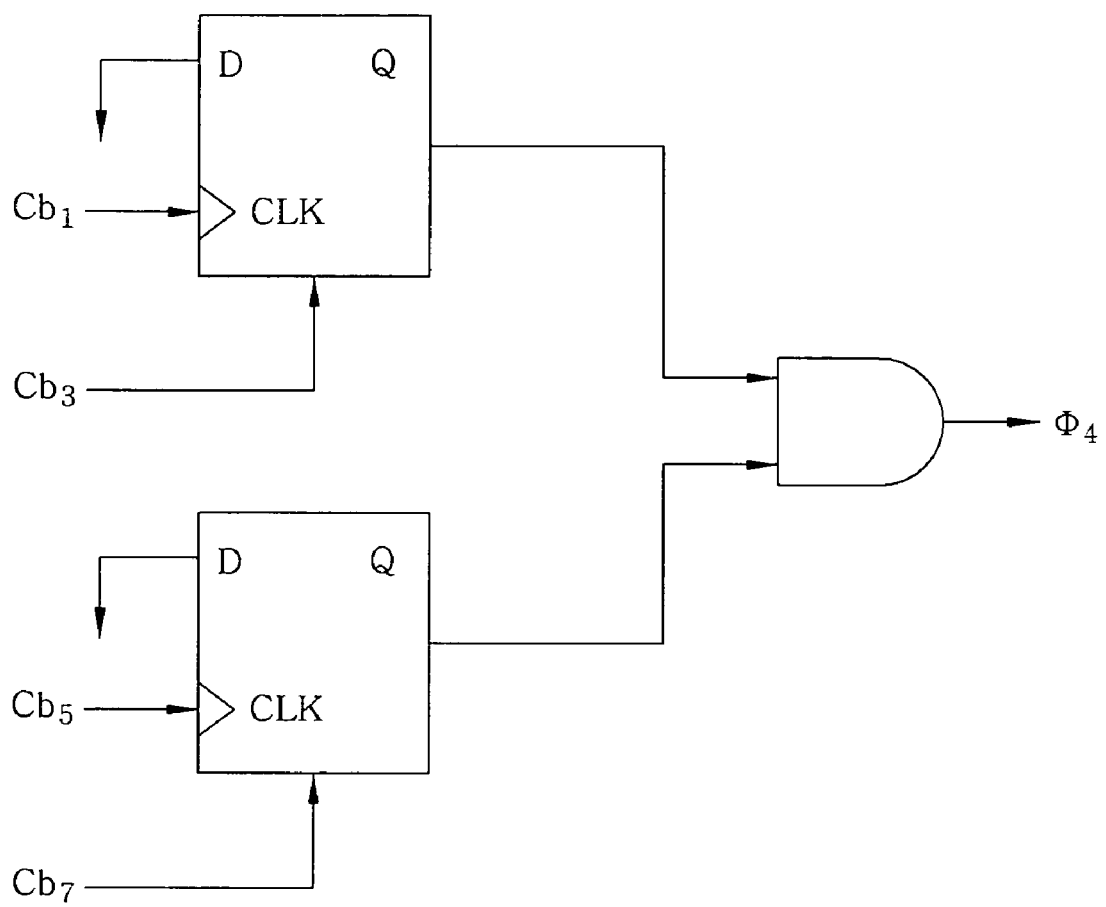
FIG. 13 is a circuit diagram for generating a fourth multiphase clock according to an embodiment of the invention.

FIG. 10 shows operation waveforms of the multiphase clock generation circuit shown in FIG. 9. $C_0$ and $C_2$ are used as clock and reset inputs of the first DFF, respectively. $C_4$ and $C_6$ are used as clock and reset inputs of the second DFF, respectively. Output signals X and Y of these DFFs are input to an AND gate from which a $\Phi_1$ clock is generated. In a similar way, circuits shown in FIGS. 11, 12 and 13 generate $\Phi_2$, $\Phi_3$ and $\Phi_4$ clocks, respectively.

<Dithering Circuit>

Figure 14:
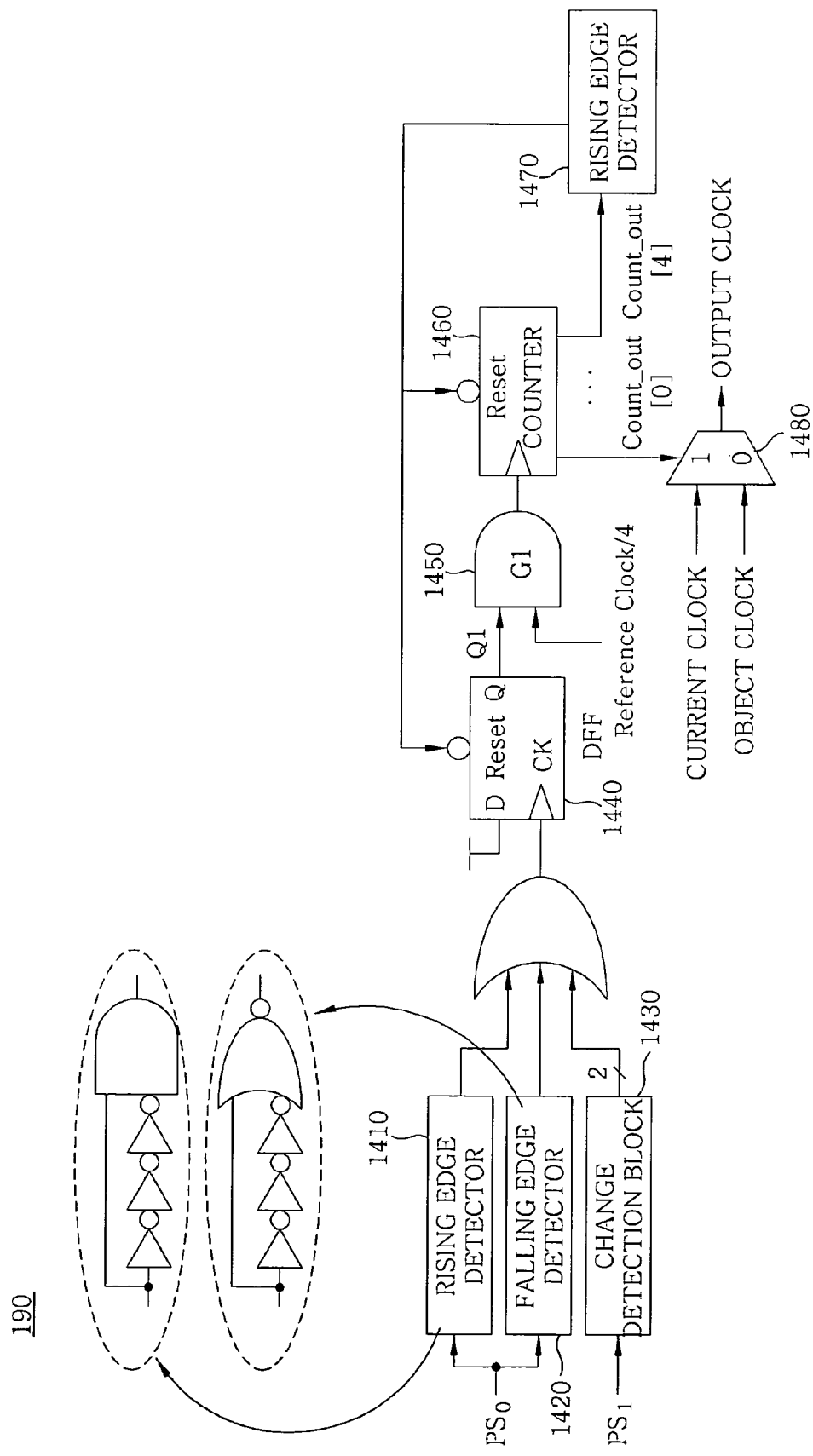
FIG. 14 is a detailed circuit diagram of a dithering circuit according to an embodiment of the invention.

FIG. 14 is a detailed circuit diagram of a dithering circuit according to an embodiment of the invention.

Noise may be caused in a power source voltage by frequency change due to operation of the frequency multiplier 180 used in the present invention. That is, power source voltage noise may occur due to parasitic inductance produced in conductors through which the power source voltage is applied to the entire chip. Since such power source voltage noise is in proportion to variation of current flowing through the conductors, the power source voltage noise increases with sudden change of an operation frequency of the frequency multiplier 180.

Accordingly, the present invention further provides a dithering circuit 190 to reduce power source voltage noise by repeatedly alternating between a frequency before being changed and a frequency after being changed even when a frequency of an output clock is suddenly changed.

Referring to FIG. 14, the dithering circuit 190 removes interior noise existing in a multiplied clock output from the frequency multiplier 180 and outputs a last multiplied clock with no noise to the external.

That is, the dithering circuit 190 plays a role in removing interior noise as much as possible, which is one of interference signals produced by change of a multiplication ratio, by switching between a multiplied clock before being changed and a multiplied clock after being changed at least one time even when a controller provided in the frequency multiplier 180 changes a multiplication ratio of a reference clock $A_0$ as necessary.

Details of the dithering circuit 190 according to the embodiment of the present invention will be described below.

The dithering circuit 190 includes a first rising edge detector 1410, a first falling edge detector 1420, a change detection block 1430, a D flip-flop (DFF) 1440, an AND gate (G1) 1450, a counter 1460, a multiplexer 1480 and a second rising edge detector 1470.

When the controller of the frequency multiplier 180 attempts to change a multiplication ratio of a multiplied clock using a 2-bit control signal, the dithering circuit 190 detects this attempt and alternately outputs a multiplied clock after being changed and a multiplied clock before being changed. At this time, the change detection block 1430 detects change of the 2-bit control signal.

The change detection block 1430 generates a short pulse when each bit of the 2-bit control signal is changed from 1 to 0 and vice versa. The short pulse is input to a clock terminal of DFF 1440 to change an output Q of DFF 1440 into '1' and cause one input of the AND gate (G1) 1450 coupled to the output Q1 of DFF 1440 to become '1.'

In addition, the short pulse outputs a clock signal Reference/4, which is input into the other input terminal of the AND gate (G1) 1450, to the external.

Conversely, if one input of the AND gate (G1) 1450 coupled to the output Q1 of DFF 1440 is '0,' an output of the AND gate (G1) 1450 becomes '0' irrespective of an input value transmitted from the other input terminal.

The reference clock signal Reference/4 output so is four times as slow as a standard clock and is input to the next stage, i.e., the counter 1460.

MSB (counter out[4]) of the counter 1460 continues to operate until it becomes '1' and LSB (counter out[0]) of the counter 1460 is applied as an input value of the multiplexer 1480. The multiplexer 1480 outputs a multiplied clock before being changed if LSB is '1' and outputs a multiplied clock after being changed if LSB is '0.'

When MSB is changed from '0' to '1' as a counter value becomes increase, the second rising edge detector 1470 generates a short pulse to reset the output value Q1 of DFF 1440 and the output value of the counter 1460 to '0' simultaneously. In this case, one bit of the 2-bit control signal pauses until a next value is input.

As a result, the dithering circuit 190 prevents parasitic interior noise from occurring in a multiplied clock by switching between the multiplied clock before being changed and the multiplied clock after being changed using the 2-bit control signal.

A dithering method of the dithering circuit according to the embodiment of the present invention will be described below.

A dithering method of the dithering circuit is to prevent parasitic interior noise from occurring in a multiplied clock by switching between a multiplied clock before being changed and a multiplied clock after being changed one or more times using the 2-bit control signal.

First, upon detecting change of the 2-bit control signal, a plurality of change detection blocks generates a short pulse when each bit of the 2-bit control signal is changed from 1 to 0 and vice versa. DFF receives the short pulse at its clock terminal CK and changes an output value of its output terminal Q into 1 or 0.

At this time, as the first input terminal of an AND gate coupled to the output terminal Q of DFF receives 1 transmitted from the output terminal Q1 of DFF, the output terminal of the AND gate outputs a reference clock signal Reference/4 input to its second input terminal.

If the first input terminal of the AND gate receives a value 0 from the output terminal Q1 of DFF, the output terminal of the AND gate outputs a value 0 irrespective of an input value of the second input terminal.

A counter receives the reference clock signal from the output terminal of the AND gate, continues to operate until a counter value of a MSB (counter out[4]) address becomes 1, and transmits a counter value of an LSB (counter out[0]) address to the external.

A multiplexer outputs a multiplied clock before being change if it receives a counter value 1 of the LSB (counter out[0]) address and outputs a multiplied clock after being change if it receives a counter value 0 of the LSB (counter out[0]) address.

When a counter value of the MSB (counter out[4]) address is changed from 0 to 1, a rising edge detector additionally generates a short pulse to reset an output value of the output terminal Q1 of DFF and an output value of the output terminal of the counter to '0' simultaneously.

While the present invention has been particularly shown and described with reference to exemplary embodiments thereof, it will be understood by those skilled in the art that various changes in form and details may be made therein without departing from the spirit and scope of the present invention. The exemplary embodiments are provided for the purpose of illustrating the invention, not in a limitative sense. Thus, it is intended that the present invention covers the modifications and variations of this invention provided they come within the scope of the appended claims and their equivalents.

What is claimed is:

1. A delay-locked loop-based multiphase clock generator that generates a plurality of multiphase clocks from a source signal that is input from external using a voltage controlled delay line including a plurality of dummy cells, comprising:
    a dithering circuit configured to remove interior noise parasitic to a multiplied clock by switching between the multiplied clock before being changed and the multiplied clock after being changed at least one time even when a multiplication ratio preset by a frequency multiplier is changed, the dithering circuit including:
        a plurality of change detection blocks configured to detect change of a 2-bit control signal and generate a short pulse when each bit of the 2-bit control signal is changed from 1 to 0 and vice versa;
        a D flip-flop configured to receive the short pulse at a clock terminal and change an output value into 1 or 0;
        an AND gate having a first input terminal coupled to an output terminal of the D flip-flop and a second input terminal at which a reference clock signal is received;
        a counter configured to receive the reference clock signal, continue to operate until a counter value of an MSB address becomes 1, and output a counter value of an LSB address to the external;
        a multiplexer configured to output a multiplied clock before being changed upon receiving a counter value 1 of the LSB address and output a multiplied clock after being changed upon receiving a counter value 0 of the LSB address; and
        a rising edge detector configured to, when the counter value of the MSB address is changed from 0 to 1, further generate the short pulse to reset an output value of an output terminal of the D flip-flop and an output value of an output terminal of the counter to 0 simultaneously.

2. The delay-locked loop-based multiphase clock generator according to claim 1, wherein, when an input value of the first input terminal coupled to the output terminal of the D flip-flop is 0, an output value of an output terminal of the AND gate is equal to 0 irrespective of an input value of the second input terminal.

3. The delay-locked loop-based multiphase clock generator according to claim 1, further comprising:
  an anti-harmonic lock circuit configured to receive an input clock and a reference clock among multiple clocks and determine whether a pulse signal derived from the input clock is within a normal locking range of the reference clock;
  a delay-locked loop configured to receive the multiple clocks, calibrate and control a phase difference between the input clock and the reference clock, if any, using a compulsory control signal transmitted from the anti-harmonic lock circuit, and convert an UP signal or a DOWN signal indicating the phase difference into a control voltage to generate multiple calibration clocks for applying the control voltage to the multiple clocks; and
  a frequency multiplier configured to set a multiplication ratio as a 2-bit control signal and generate a multiplied clock by multiplying the multiple calibration clocks by the set multiplication ratio.

4. The delay-locked loop-based multiphase clock generator according to claim 3, wherein the anti-harmonic lock circuit is configured to remove even-numbered pulses of the input clock using at least one D flip-flop and at least one NAND gate.

5. The delay-locked loop-based multiphase clock generator according to claim 4, wherein the anti-harmonic lock circuit is configured to use an output signal of an edge detector to which an output signal of the NAND gate is input, as a reset signal of the D flip-flop.

6. The delay-locked loop-based multiphase clock generator according to claim 3, wherein the delay-locked loop includes:
  a phase detector configured to use the compulsory control signal transmitted from the anti-harmonic lock circuit to compulsorily control an UP signal or a DOWN signal indicating a phase difference between a pulse signal existing in the input clock and the reference clock;
  a charge pump configured to convert the UP signal or the DOWN signal indicating the phase difference into a control voltage; and
  a voltage controlled delay line configured to receive the multiple clocks and generates multiple calibration clocks by applying the control voltage, which is transmitted from the charge pump, to the multiple clocks.

7. The delay-locked loop-based multiphase clock generator according to claim 1, further comprising:
  a self-calibration buffer configured to self-calibrate irregular delay pulse widths formed between delay clocks belonging to multi-delayed clocks that are converted from clocks output from the voltage controlled delay line such that the delay pulse widths become equal to each other by controlling size or position of one or more delay clocks selected from among the delay clocks.

* * * * *